United States Patent
Schoenfeld et al.

(10) Patent No.: US 6,181,540 B1
(45) Date of Patent: Jan. 30, 2001

(54) DEVICE AND METHOD FOR ELECTROSTATIC DISCHARGE PROTECTION OF A CIRCUIT DEVICE

(75) Inventors: Aaron M. Schoenfeld, Boise; Alan J. Wilson, Nampa, both of ID (US)

(73) Assignee: Micron Technology, Inc., Boise, ID (US)

( * ) Notice: Under 35 U.S.C. 154(b), the term of this patent shall be extended for 0 days.

(21) Appl. No.: 09/209,210

(22) Filed: Dec. 10, 1998

Related U.S. Application Data (63) Continuation of application No. 08/802,665, filed on Feb. 19, 1997.

(51) Int. Cl.[7] .................................................. H02H 9/00
(52) U.S. Cl. ................................................................ 361/56
(58) Field of Search .............................. 361/18, 56, 58, 361/91, 111, 119; 257/355–358

(56) References Cited

U.S. PATENT DOCUMENTS

| | | | |
|---|---|---|---|
| 5,293,057 | 3/1994 | Ho | 257/356 |
| 5,315,255 | 5/1994 | Bettinger | 324/457 |
| 5,654,862 | 8/1997 | Worley | 361/111 |
| 5,721,658 | 2/1998 | Ma | 361/111 |

OTHER PUBLICATIONS

Input/Output Electrostatic Discharge Protection For Devices With Multiple Individual Power Groups Serial No. 08/961,341, filed Oct. 30, 1997, Docket No. 95–0863.01, Manny Ma (Continuation of Patent No. 5,721,658, issued Feb. 24, 1998, Serial No. 08/625,333, Docket No. 95–0863).

*Primary Examiner*—Ronald W. Leja
(74) *Attorney, Agent, or Firm*—Charles Brantley (57) ABSTRACT

An circuit device includes a stack of electrostatic discharge protection devices shared between a plurality of contact pads on the device. In addition, each contact pad is coupled to its own individual protection device. Together, the individual protection devices and the stack establish a trip point for shunting a charge from the contact pads in the event that any of the pads reach a voltage potential greater than the trip point. In doing so, the stack protects internal operations circuits from damage. At the same time, the shared stack conserves die space.

50 Claims, 4 Drawing Sheets

FIG. 6

DEVICE AND METHOD FOR ELECTROSTATIC DISCHARGE PROTECTION OF A CIRCUIT DEVICE

RELATED APPLICATION

This application is a continuation of application Ser. No. 08/802,665, filed Feb. 19, 1997.

FIELD OF THE INVENTION

The present invention relates generally to electrostatic discharge protection arrangements for circuit devices and, more specifically, to a system and method for diverting the transmission of electrostatic discharges.

BACKGROUND OF THE INVENTION

It is well known to those skilled in the art that, during handling and testing of circuit devices, electrostatic charges can be applied to the contact pads of such a device. These charges may be subsequently discharged through the device, thereby causing damage. One solution known in the prior art for preventing damage from these electrostatic discharge (ESD) events is to connect protection devices, such as p-n junction diodes, between each contact pad and its corresponding operations circuit. Typically, one such diode leads to a voltage source $V_{CC}$ and another leads to ground. In the event a sufficient charge builds up on a contact pad, one of the two diodes will activate and direct the charge away from the operations circuit. Further, the activation of the diodes will be based on their threshold voltage ($V_t$). For example, a positive charge will be diverted towards the voltage source $V_{CC}$ when the contact pad's potential exceeds one $V_t$ above $V_{CC}$. Alternatively, a negative charge will be diverted toward ground when the contact pad's potential is one $V_t$ below ground.

Occasionally, it is desirable to drive an operations circuit at voltages beyond the one $V_t$ parameters. Those of ordinary skill in the art know that the trip point for shunting charges can be changed by adding diodes to the configuration described above. Nevertheless, based on prior art teachings, changing the trip point for several operations circuits would require adding diodes for each contact pad. Unfortunately, these diodes, as well as other ESD protection devices, require a significant amount of die space. Thus, it would be desirable to provide ESD protection, while at the same time allowing for the alteration of the trip point without the space requirements necessary in the prior art.

SUMMARY OF THE INVENTION

Accordingly, the present invention provides for ESD protection and trip point alteration of a circuit device. Several embodiments of the present invention are designed to accommodate a circuit device having a plurality of terminals, each leading to a different operations circuit. In one preferred embodiment of the present invention, an ESD protection device is connected to each terminal. These ESD protection devices, in turn, are commonly coupled to a stack of additional ESD protection devices. The number of devices in this stack depends upon the particular trip point to be established. Thus, in addition to protecting the device from ESD, the shared stack in this preferred embodiment has the added advantage of reducing the number of ESD protection devices needed to safeguard the operations circuits. Further, this configuration allows for simultaneous trip point alteration for different operations circuits, once again reducing the number of ESD protection devices needed to do so.

The present invention also encompasses various methods for achieving these advantages.

DETAILED DESCRIPTION OF THE PREFERRED EMBODIMENTS

Figure 1:
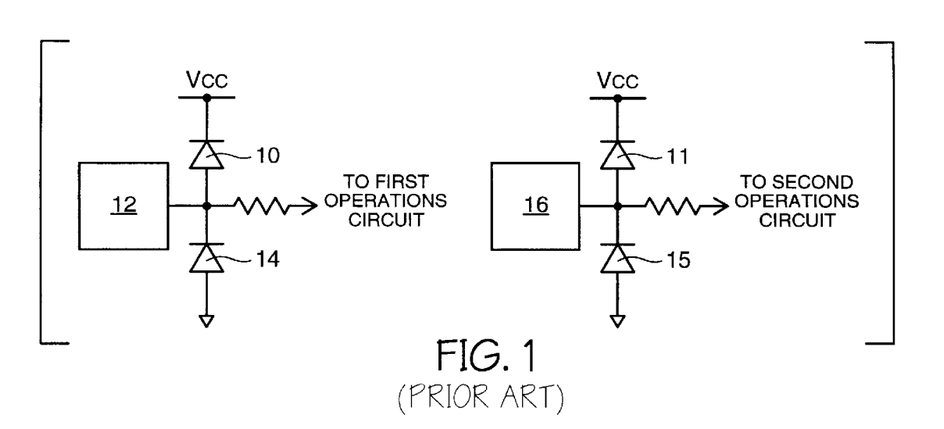
FIG. 1 illustrates an ESD protection circuit as found in the prior art.

A standard ESD protection circuit is illustrated in FIG. 1, wherein a first diode 10 is coupled to the supply voltage $V_{CC}$ and is provided for a first contact pad 12. The first contact pad 12, in turn, leads to a first operations circuit of a semiconductor device. For purposes of this application, the term "contact pad" refers to any conductive surface configured to permit temporary or permanent communication with an external operations circuit or node. A second diode 14 is coupled between the first contact pad 12 and ground. Similarly configured diodes 11 and 15 can be coupled to a second contact pad 16, which leads to a second operations circuit. In fact, generally every contact pad on the device can be configured in a similar manner. For purposes of clarity, however, only two such pads are illustrated in FIG. 1. Should a sufficient charge build up on the first contact pad 12, one of the two diodes 10 or 14 will turn on and shunt the charge away from the operations circuit. As discussed in the background section, this configuration allows an operations circuit to accommodate voltages ranging from one $V_t$ greater than the supply voltage $V_{CC}$ to one $V_t$ less than ground before a charge is diverted. As an example of the operation of this prior art configuration, the first diode 10 will turn on should contact pad 12 have a charge with a voltage potential that is one $V_t$ greater than $V_{CC}$. At that point, the first diode 10 turns on, thereby creating a path of lesser electrical resistance than the path leading to the operations circuit. As a result, the first diode 10 shunts the charge through itself and to the voltage source. Similarly, the second diode 14 has a trip point of one $V_t$ less than ground. When the voltage potential of a charge at the first contact pad 12 reaches that point, the second diode 14 turns on and draws the current through itself toward ground. Charges at the second contact pad 16 are handled in the same manner.

Figure 2:
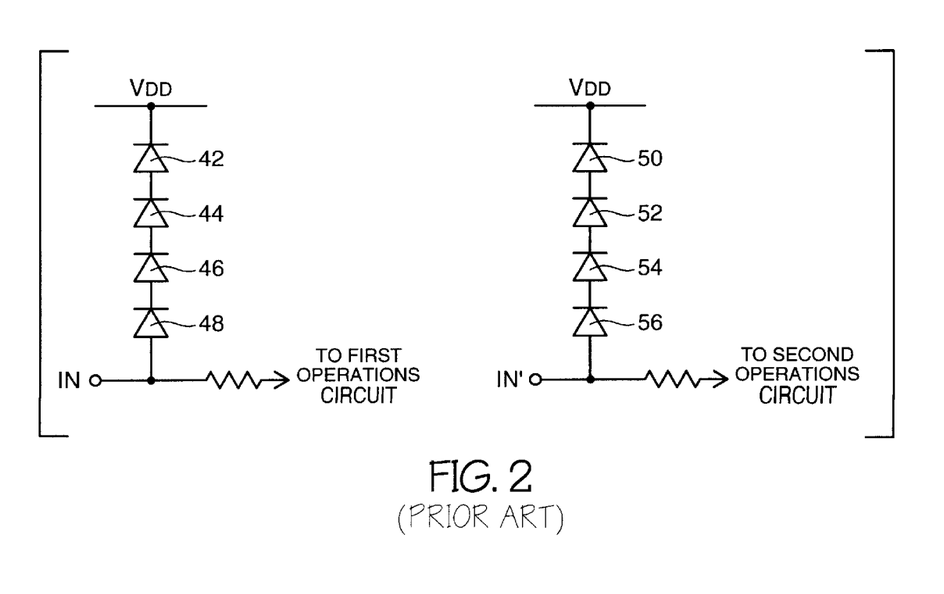
FIG. 2 demonstrates a prior art example of an ESD protection circuit using multiple diodes to alter the trip point at which current is diverted.

FIG. 2 highlights a prior art configuration in which the trip point of the ESD protection circuits is increased. Four diodes 42, 44, 46, and 48 are coupled between an input contact point IN and the source voltage which, in this case, is labeled $V_{DD}$. As a result, a charge at IN will not be diverted until the voltage potential reaches four $V_t$'s above $V_{DD}$. It is noteworthy that this multiple diode protection circuit is repeated for a second operations circuit, wherein four diodes 50, 52, 54, and 56 are electrically interposed between an input contact point IN' and $V_{DD}$. Further, the same configuration is used for every input terminal in this prior art example. Thus, this example teaches that changing the trip point for multiple operations circuits requires adding diodes for each contact point.

Figure 3:
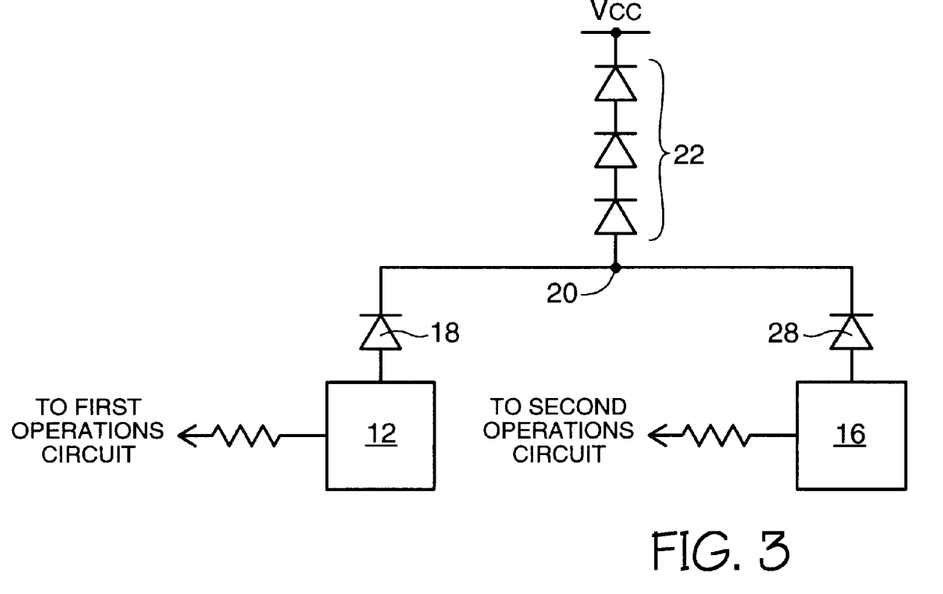
FIG. 3 demonstrates one exemplary embodiment of an ESD protection device in accordance with the present invention.

A preferred embodiment of the invention using fewer gates to achieve the same effect appears in FIG. 3. A first contact pad 12 and a second contact pad 16 are again shown, although it is understood that a pad plurality of any size will benefit from this invention. The first contact pad 12 is coupled to an exclusive diode 18 that is configured to protect only the first contact pad 12. Similarly, the second contact pad 16 is also coupled to an exclusive diode 28. Exclusive diodes 18 and 28 share a first common node 20. A positive ESD diode stack 22 is coupled to the first common node 20 and is further configured to receive a voltage source, $V_{CC}$, although the voltage source itself is not a part of the invention. In FIG. 3, the positive ESD diode stack 22 comprises three diodes. It is understood, however, that the positive ESD diode stack 22 could contain any number of diodes coupled in series, cathode-to-anode, so that current is conducted predominantly in only one direction through the stack. Moreover, the diode stack as generally used in this and other embodiments may comprise only one diode. Given the stack size in FIG. 3 combined with the exclusive diode 18, a charge on the first contact pad 12 reaching a voltage potential of four $V_t$'s above $V_{CC}$ will be drawn away from the first operations circuit towards the voltage source. Moreover, the orientation of the exclusive diode 28 isolates the second contact pad 16 from a positive ESD event transmitted through the first contact pad 12. Conversely, exclusive diode 18 will isolate the first contact pad 12 from any ESD at the second contact pad 16. As a result, this embodiment has established a trip point of four $V_t$'s above $V_{CC}$ for protecting both contact pads 12 and 16 using only five diodes, whereas prior art systems require eight diodes—four for each contact pad.

Figure 4:
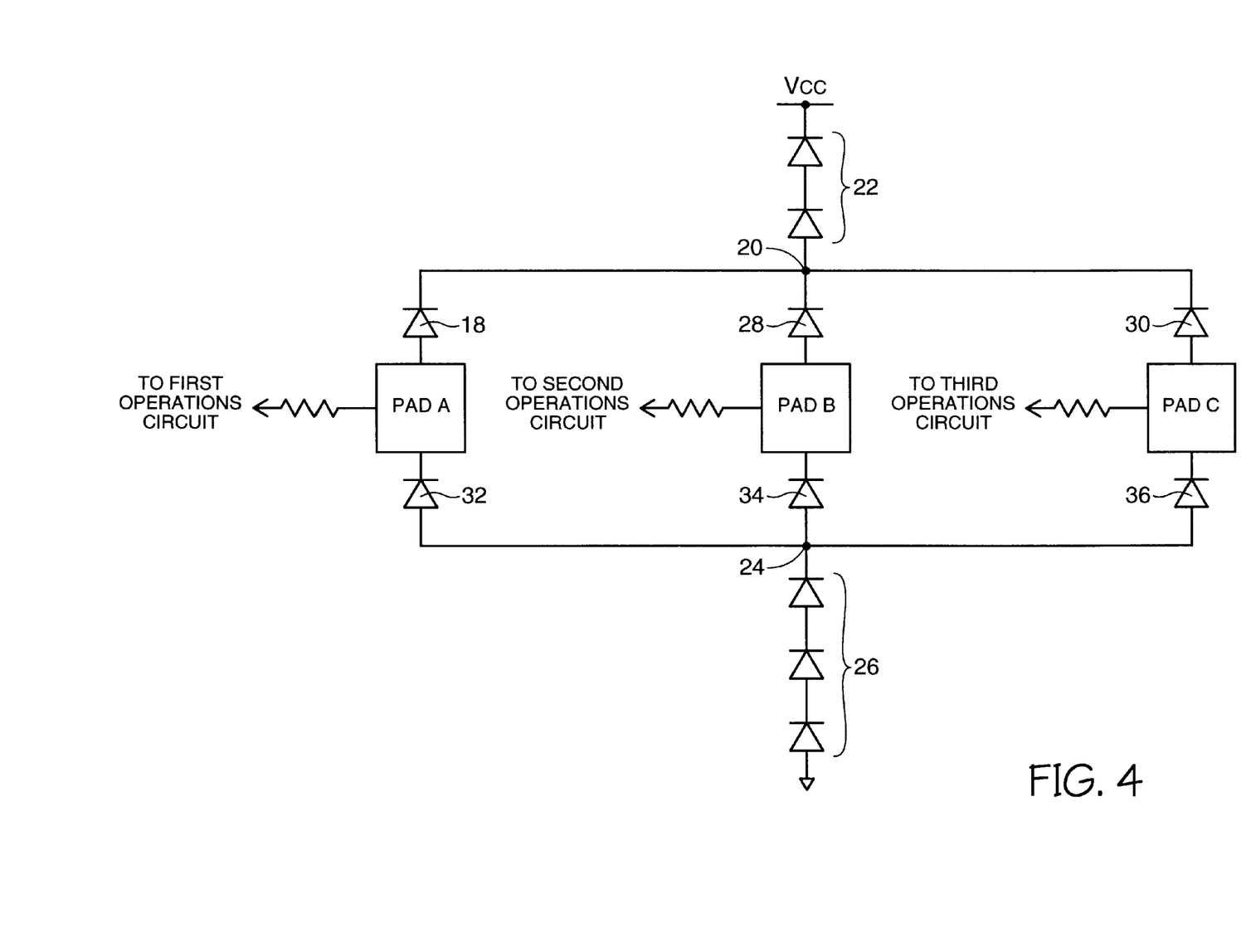
FIG. 4 demonstrates a second exemplary embodiment in accordance with the present invention.

FIG. 4 shows another exemplary embodiment in which three contact pads A, B, and C, each coupled to a separate operations circuit, are protected from a positive ESD event by three exclusive diodes 18, 28, and 30, as well as a positive ESD diode stack 22 comprising two diodes. This second embodiment also illustrates that a shared stack of diodes can be used to protect against negative ESD events as well. Three exclusive diodes 32, 34, and 36 are provided, one at each contact pad, and share a second common node 24. A negative ESD diode stack 26 is coupled to the second common node 24 and is configured to connect to ground, although ground is not claimed as part of the current invention. As with the positive ESD diode stack 22, the negative ESD diode stack 26 may comprise one or more diodes. In FIG. 4 the negative ESD diode stack 26 comprises a series of three diodes, thereby demonstrating that the size of the negative ESD diode stack 26 may differ in size from the positive ESD diode stack 22. The negative ESD diode stack 26 and the exclusive diodes 32, 34, and 36 coupled to it are configured to draw an electric charge from any of the contact pads having a negative voltage potential exceeding four $V_t$'s below ground. In addition, the orientation of the three exclusive diodes 32, 34, and 36 serve to isolate each contact pad from negative ESD events originating at the other pads. Thus, the operations circuits in FIG. 4 are protected from a negative ESD event that might be transmitted through the pads shown. For such an event, this exemplary embodiment also establishes a trip point of four $V_t$'s below ground using only 6 diodes, whereas the prior art would require 12 diodes.

Figure 5:
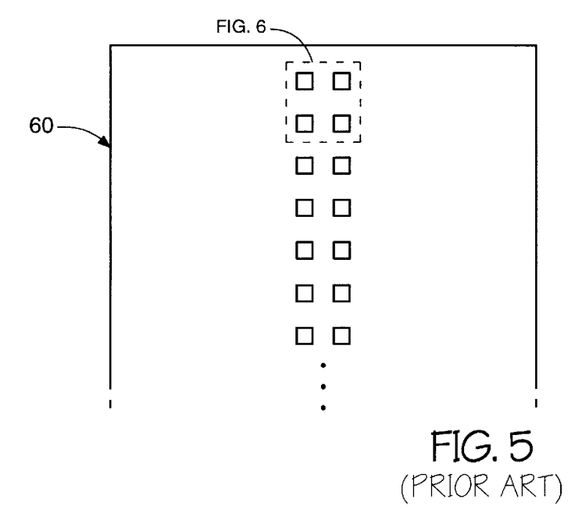
FIG. 5 depicts a contact pad configuration found on a particular device in the prior art.
Figure 6:
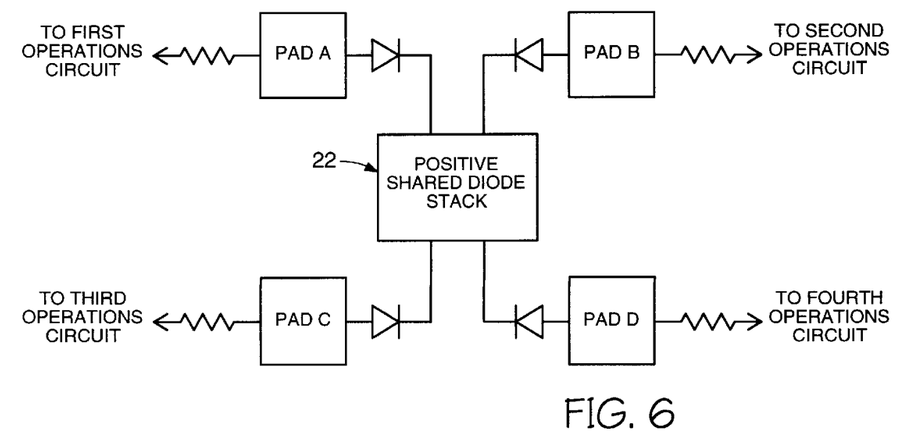
FIG. 6 is a close-up, top-down view of the device in FIG. 5 and demonstrates a third exemplary embodiment in accordance with the present invention.

From the exemplary embodiments in FIGS. 3 and 4, it follows that more space on the circuit device is saved as the number of pads sharing diode stacks increases. The invention would be particularly useful given the contact pad configurations of certain circuit devices in current use. FIG. 5 illustrates such a device, wherein the contact pads are located in the center of a die 60 and extend in two columns down its length. The close-up view in FIG. 6 demonstrates how four contact pads on this device may be wired to share a positive ESD diode stack 22. Given the proximity of each contact pad to the others in this device, even more contact pads may share the positive ESD diode stack 22 for a greater saving of space. Further, the contact pads could also share a negative ESD diode stack.

One of ordinary skill in the art can appreciate that, although specific embodiments of this invention have been described above for purposes of illustration, various modifications may be made without departing from the spirit and scope of the invention. For example, protection devices other than p-n junction diodes may be used to shunt current away from the operations circuits, such as metal-oxide semiconductor field effect transistor (MOSFET) diodes and bipolar junction transistors (BJT's). In addition, it should be noted that the contact pads discussed above could serve as either input pads or output pads. Accordingly, the invention is not limited except as stated in the claims.

What is claimed is:

1. A semiconductor device having a first contact pad coupled to a first operations circuit and a second contact pad coupled to a second operations circuit, comprising:
   an ESD protection circuit, comprising:
      a first charge shunting device coupled to said first contact pad and removed from a direct connection to any discharge node other than said first contact pad;
      a second charge shunting device coupled to said second contact pad and removed from a direct connection to any discharge node other than said second contact pad; and
      a third charge shunting device configured to couple at a first end to a discharge node and coupled at a second end to said first and second charge shunting devices.

2. The semiconductor device of claim 1, wherein said first and second charge shunting devices are of a first type and said third charge shunting device is of a second type.

3. The semiconductor device of claim 1, wherein said first charge shunting device is of a first type, said second charge shunting device is of a second type and said third charge shunting device is of a third type.

4. The semiconductor device of claim 1, wherein said first charge shunting device, said second charge shunting device, and said third charge shunting device are oriented to divert a negative ESD event.

5. An ESD protection circuit for a semiconductor device having at least two operations circuits, comprising:
   at least two ESD protection devices;
   at least two external communication terminals, wherein:
      said external communication terminals are respectively coupled to said ESD protection devices, and
      said external communication terminals are respectively coupled to said operations circuits of said semiconductor device; and
   at least one additional ESD protection device coupled to said two ESD protection devices and configured to conduct current to only one voltage node in cooperation with said at least two ESD protection devices.

6. The ESD protection circuit in claim 5 wherein said external communication terminals are contact pads.

7. The ESD protection circuit in claim 6 wherein said additional ESD protection device is configured to accept a voltage source.

8. The ESD protection circuit in claim 6 wherein said additional ESD protection device is configured to be coupled to ground.

9. An ESD shunter for a semiconductor device having a plurality of contact pads, comprising:
- a current drawing stack configured to directly couple to only one voltage potential;
- a plurality of current drawing devices corresponding to said plurality of contact pads, wherein each of said plurality of current drawing devices is electrically interposed between a respective contact pad of said plurality of contact pads and said current drawing stack.

10. The ESD shunter in claim 9 wherein said current drawing stack comprises at least one p-n junction diode.

11. The ESD shunter in claim 10 wherein said plurality of current drawing devices comprises a plurality of p-n junction diodes.

12. The ESD shunter in claim 10 wherein said plurality of current drawing devices comprises at least one p-n junction diode per contact pad of said plurality of contact pads.

13. An ESD protection system comprising:
- an ESD diverting stack configured to couple to a non-ground voltage source;
- a first supplemental ESD diverting device coupled to a first contact pad and said ESD diverting stack; and
- a second supplemental ESD diverting device coupled to a second contact pad and said ESD diverting stack.

14. The system in claim 13 wherein said ESD diverting stack comprises a plurality of ESD diverting devices.

15. The system in claim 14 wherein there are at least two types of ESD diverting devices comprising said ESD diverting stack.

16. The system in claim 14 wherein said ESD diverting stack comprises a plurality of ESD diverting devices coupled in series.

17. The system in claim 16 wherein said ESD diverting stack comprises a plurality of bipolar junction transistors.

18. An ESD protection system for a device having a plurality of contact pads, comprising:
- a plurality of isolating ESD protection devices coupled in a one-to-one correspondence with said plurality of contact pads, wherein said plurality of isolating ESD protection devices are separated from direct electrical contact with a voltage source other than said plurality of contact pads; and
- at least one common ESD protection device connected to each of said plurality of isolating ESD protection devices.

19. A device-sharing protection system for a first operations circuit having a first contact pad and a second operations circuit having a second contact pad, comprising:
- a first discharge shunting device coupled to said first contact pad;
- a second discharge shunting device coupled to second contact pad; and
- a third discharge shunting device coupled to a first discharge node, said first discharge shunting device, and to said second discharge shunting device, wherein said first discharge shunting device, said second discharge shunting device, and said third discharge shunting device define a first orientation with respect to said first discharge node.

20. The system of claim 19, wherein said first discharge shunting device, said second discharge shunting device, and said third discharge shunting device share a common node.

21. The system of claim 20 further comprising:
- a fourth discharge shunting device coupled to said first contact pad;
- a fifth discharge shunting device coupled to said second contact pad; and
- a sixth discharge shunting device coupled to a second discharge node, said fourth discharge shunting device, and to said fifth discharge shunting device, wherein said fourth discharge shunting device, said fifth discharge shunting device, and said sixth discharge shunting device are configured to define a second orientation with respect to said second discharge node.

22. An ESD protector for a die having a plurality of contact pads, comprising:
- a plurality of discharge pathways leading to only one discharge node, wherein each of said plurality of contact pads is respectively coupled to one of said plurality of discharge pathways;
- a plurality of discharge devices, wherein each of said plurality of discharge devices is coupled to one of said plurality of discharge pathways; and
- a discharge stack coupled to said plurality of discharge pathways and to a discharge node.

23. The ESD protector in claim 22, wherein:
- each contact pad of said plurality of contact pads is in generally close proximity to other contact pads of said plurality of contact pads; and
- said discharge stack is in generally close proximity to said plurality of contact pads.

24. The ESD protector in claim 23, wherein:
- said plurality of contact pads are arranged in a plurality of queues extending along an axis of said die; and
- said discharge stack is aligned with said axis of said die.

25. The ESD protector of claim 24, wherein:
- said plurality of queues are within an inner portion of said die; and
- said discharge stack is interposed between two queues of said plurality of queues.

26. The ESD protector of claim 25 wherein said discharge stack is electrically and physically interposed between said two queues.

27. An ESD protection circuit for a plurality of circuitry components respectively connected to a plurality of charge reception points, wherein all of said plurality of circuitry components are configured to operate at a generally identical voltage level, comprising:
- a first plurality of discharge isolation devices, wherein each discharge isolation device of said first plurality of discharge isolation devices is respectively coupled to one charge reception point of said plurality of charge reception points; and
- a first charge directing device coupled to said first plurality of discharge isolation devices, wherein said first charge directing device and said first plurality of discharge isolation devices are configured to divert an ESD event from at least one charge reception point of said plurality of charge reception points toward at most one potential.

28. The ESD protection circuit of claim 27, wherein each discharge isolation device of said first plurality of discharge isolation devices is configured to isolate a coupled charge reception point from an ESD originating at another charge reception point.

29. The ESD protection circuit of claim 28, wherein each discharge isolation device of said first plurality of discharge isolation devices is also configured to protect a circuitry component respectively connected to a coupled charge reception point.

30. The ESD protection circuit of claim 29, further comprising:
a second plurality of discharge isolation devices, wherein one discharge isolation device of said second plurality of discharge isolation devices is connected to each charge reception point of said plurality of charge reception points; and
a second charge directing device coupled to said second plurality of discharge isolation devices, wherein said second charge directing device and said second plurality of discharge isolation devices are configured to divert an ESD event from at least one charge reception point of said plurality of charge reception points toward said second charge directing device.

31. A method of forming a protection circuit on a semiconductor device to minimize an ESD effect on a plurality of operations circuits corresponding to a plurality of terminals of said semiconductor device, comprising:
providing at least one initial charge deflecting device;
joining said initial charge deflecting device to a plurality of additional charge deflecting devices;
respectively coupling said plurality of additional charge deflecting devices to said plurality of terminals of said semiconductor device; and
preventing direct electrical contact between any of said plurality of additional charge deflecting devices and any voltage source except for said terminals.

32. The method in claim 31, further comprising a step of isolating an ESD event at one of said plurality of terminals from other terminals of said plurality of terminals.

33. The method in claim 32, wherein said isolating step further comprises orienting each of said plurality of additional charge deflecting devices against an ESD event originating at a non-respective terminal.

34. The method in claim 33 further comprising a step of routing a charge resulting from an ESD event to said initial charge deflecting device.

35. The method in claim 34, wherein said routing step comprises directing said charge toward a node connectable to a voltage source.

36. The method in claim 34, wherein said routing step comprises directing said charge toward a node connectable to ground.

37. A method for maintaining ESD protection while establishing a voltage range used in a plurality of operations circuits having a respective plurality of terminals, comprising:
providing a plurality of ESD diversion devices for said plurality of terminals, wherein each terminal of said plurality of terminals is coupled to a particular ESD diversion device of said plurality of ESD diversion devices;
linking a common ESD diversion device to said plurality of ESD diversion devices;
connecting additional ESD diversion devices to said common ESD diversion device to the extent sufficient to accommodate said voltage range; and
restricting direct electrical contact between said plurality of ESD diversion devices and voltage sources to contact between said plurality of ESD diversion devices and said plurality of terminals.

38. A method of customizing a trip point for shunting current in a device having a plurality of contact points, comprising the following steps:
providing one exclusive current shunting device for each of said plurality of contact points; and
providing a number of supplementary current shunting devices common to at least two of said plurality of contact points, wherein each of said number of supplementary current shunting devices is configured to couple to a single voltage source, and wherein said number is sufficient to establish a trip point in relation to said single voltage source for said two of said plurality of contact points.

39. The method in claim 38, wherein the step of providing a number of supplementary current shunting devices comprises providing at least one supplementary current shunting device.

40. A method of protecting from ESD a device having a plurality of terminals respectively coupled to a plurality of operations circuits, comprising the steps of:
isolating each of said plurality of terminals from an ESD event originating from other terminals of said plurality of terminals;
electrically interposing a main current drawing device between said plurality of terminals and a voltage potential node;
directly coupling said main current drawing device to no more than one voltage potential node; and
configuring said main current drawing device to activate in response to one of said plurality of terminals reaching a voltage approaching a voltage associated with said ESD event.

41. The method in claim 40, wherein said isolating step comprises respectively electrically interposing a plurality of additional current drawing devices between said plurality of terminals and said main current drawing device.

42. A method of ESD protection for circuitry components having a plurality of terminals, comprising the following steps:
providing a primary discharge device common to said plurality of terminals;
providing a plurality of secondary discharge devices, wherein each is unique to a terminal of said plurality of terminals;
enabling said plurality of terminals to be coupled to a discharge node exclusively through said plurality of secondary discharge devices and said primary discharge device;
establishing an operable voltage range for said circuitry components; and
shunting current to said primary discharge device in response to a potential voltage outside of said operable voltage range.

43. The method in claim 42 wherein:
said step of providing a primary discharge device comprises providing at least one current shunting element; and
said step of establishing an operable voltage range comprises incorporating a particular number of current shunting elements into said primary discharge device.

44. A method of diverting current related to an ESD event and within a die having a plurality of contacts, comprising:
coupling at least one diode to each contact of said plurality of contacts;
coupling at least one common diode to every contact of said plurality of contacts through said at least one diode for each contact;

directing said current toward a potential node and away from all other potential nodes through said at least one diode coupled to one of said plurality of contacts; and further directing said current toward said potential node through said at least one common diode.

45. The method in claim 44, wherein said step of directing said current further comprises directing said current toward a positive voltage source.

46. The method in claim 44, wherein said step of directing said current further comprises directing said current toward ground.

47. The method in claim 44, wherein said step of coupling at least one common diode further comprises:

coupling a plurality of common diodes to said every contact; and altering a trip point for diverting said current for each common diode coupled.

48. The method in claim 47, wherein said step of further directing said current toward said potential node comprises directing said current substantially unidirectionally through said plurality of common diodes.

49. An ESD circuit, comprising:

a first diode configured to couple to a first contact pad of a die and further configured to conduct current toward a discharge node;

a second diode configured to couple to a second contact pad of said die and further configured to conduct current toward said discharge node; and a diode stack comprising:

a plurality of diodes coupled in series in an anode-to-cathode manner, a first end coupled said first diode and to said second diode and decoupled from any discharge node, and a second end configured to couple to said discharge node.

50. The ESD circuit in claim 49, wherein:

said first diode comprises:

an anode configured to couple to said first contact pad, and a cathode configured to couple to said first end of said diode stack;

said second diode comprises:

an anode configured to couple to said second contact pad, and a cathode configured to couple to said first end of said diode stack;

said first end comprises an anode end; and said second end comprises a cathode end configured to couple to a voltage source.

* * * * *

UNITED STATES PATENT AND TRADEMARK OFFICE
CERTIFICATE OF CORRECTION

PATENT NO. : 6,181,540 B1
DATED : January 30, 2001
INVENTOR(S) : Aaron M. Schoenfeld and Alan J. Wilson It is certified that error appears in the above-identified patent and that said Letters Patent is hereby corrected as shown below:

Column 2,
Line 67, concerning the term "IN'and", place a space between "IN" and "and".

Column 8,
Line 67, (claim 44), replace "each" with -- every --.

Signed and Sealed this

Second Day of October, 2001

*Attest:*

NICHOLAS P. GODICI
*Attesting Officer*     *Acting Director of the United States Patent and Trademark Office*